United States Patent
Thompson et al.

(10) Patent No.: US 7,236,385 B2
(45) Date of Patent: Jun. 26, 2007

(54) MEMORY ARCHITECTURE

(75) Inventors: J. Wayne Thompson, Boise, ID (US); Jeffrey P. Wright, Boise, ID (US); Victor Wong, Boise, ID (US); Jim Cullum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 10/879,158

(22) Filed: Jun. 30, 2004

(65) Prior Publication Data

US 2006/0013056 A1    Jan. 19, 2006

(51) Int. Cl.
*G11C 5/06* (2006.01)
(52) U.S. Cl. .............. 365/63; 365/189.08; 257/758; 257/211
(58) Field of Classification Search .............. 365/63
See application file for complete search history.

(56) References Cited

U.S. PATENT DOCUMENTS

| 4,295,149 | A | 10/1981 | Balyoz et al. |
| 5,459,093 | A | 10/1995 | Kuroda et al. |
| 5,751,031 | A | 5/1998 | Thompson et al. |
| 6,091,090 | A * | 7/2000 | Gheewala ............... 257/211 |
| 6,184,122 | B1 | 2/2001 | Fu et al. |
| 6,314,011 | B1 * | 11/2001 | Keeth et al. .............. 365/51 |
| 6,355,982 | B2 | 3/2002 | Ishimaru et al. |
| 6,445,065 | B1 | 9/2002 | Gheewala et al. |
| 6,664,634 | B2 * | 12/2003 | Thompson et al. ........ 257/758 |
| 6,754,802 | B1 * | 6/2004 | Kirsch .................... 712/14 |
| 6,937,532 | B2 * | 8/2005 | Hatanaka et al. .......... 365/200 |
| 2002/0131289 | A1 * | 9/2002 | Thompson et al. .......... 365/51 |
| 2003/0063497 | A1 * | 4/2003 | Keeth et al. ............. 365/200 |
| 2006/0245231 | A1 * | 11/2006 | Thompson et al. .......... 365/63 |

* cited by examiner

*Primary Examiner*—Huan Hoang
*Assistant Examiner*—Kretelia Graham
(74) *Attorney, Agent, or Firm*—Dickstein Shapiro LLP

(57) ABSTRACT

A DDR SDRAM where unidirectional row logic is associated with and connected to a single memory array instead of being associated with and connected to multiple memory arrays. The unidirectional row logic is located in the outward periphery of its associated array, but is not within a throat region between two arrays. The location of the row logic allows the throat region to include more bidirectional IO circuitry and signal lines servicing two arrays, which increases the performance of the SDRAM. In addition, separate power bussing is employed for the memory arrays and IO circuitry. This prevents noise from the arrays from affecting the IO circuitry and signal lines of the throat region and vice versa.

9 Claims, 7 Drawing Sheets

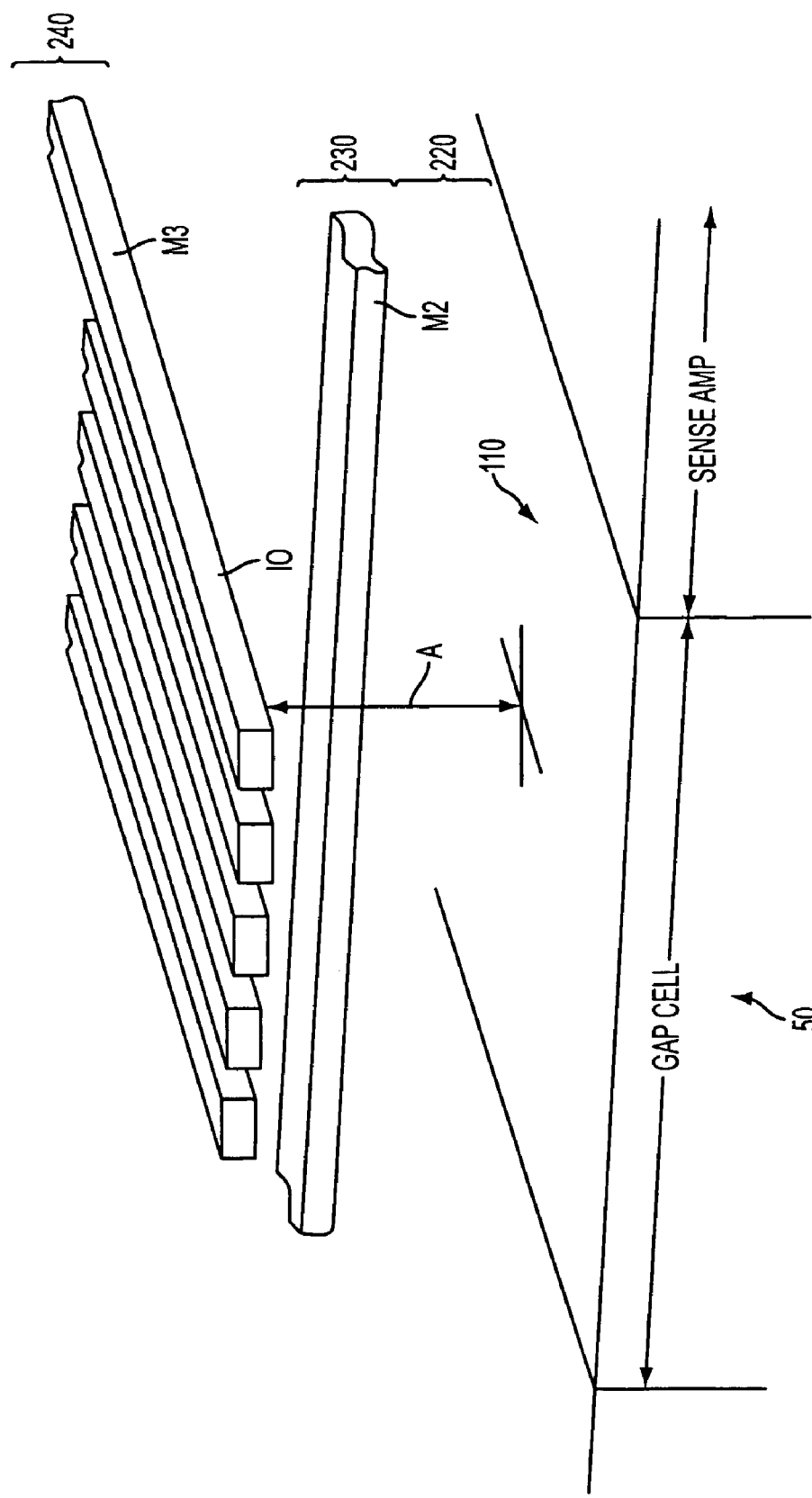

MEMORY ARCHITECTURE

FIELD OF THE INVENTION

The invention relates generally to semiconductor memory devices, and more particularly to a double data rate (DDR) synchronous dynamic random access memory (SDRAM) architecture having improved performance and size.

BACKGROUND

There is a demand for faster, higher capacity, random access memory (RAM) devices. RAM devices, such as dynamic random access memory (DRAM) devices are typically used as the main memory in computer systems. Although the operating speed of the DRAM has improved over the years, the speed has not reached that of the processors used to access the DRAM.

Synchronous dynamic random access memory (SDRAM) has been developed to provide faster operation in a synchronous manner. SDRAMs are designed to operate synchronously with the system clock. That is, input and output data of the SDRAM are synchronized to an active edge of the system clock which is driving the processor accessing the SDRAM.

Double data rate (DDR) SDRAMs and second generation DDR SDRAMs, known as DDR II SDRAMs, are being developed to provide twice the operating speed of the conventional SDRAM. These devices allow data transfers on both the rising and falling edges of the system clock and thus, provide twice as much data as the conventional SDRAM.

Referring to FIG. 1, a portion of a DDR SDRAM integrated circuit 10 is shown. The SDRAM 10 includes a plurality of memory arrays $20_a$, $20_b$, $20_c$, $20_d$ (collectively referred to herein as "arrays 20") and peripheral circuitry 60 surrounding the arrays 20. Each array has a span (e.g., spans $22_a$, $22_b$) and includes, as shown in FIG. 2, multiple memory blocks 30 separated from each other in a first direction by a plurality of sense amplifiers 52, 54 (also referred to as sense amplifier stripes), and from each other in a second direction by a plurality of row drivers 42, 44. Accordingly each memory block 30 is bounded on two opposing sides by first and second sense amplifier stripes 52, 54 respectively. Further, each memory block 30 is bounded on two other opposing sides by first and second row driver stripes 42, 44 respectively. Gap cells 50 are located at the intersection of the row drivers 42, 44 and sense amplifier stripes 52, 54. The gap cells 50 may contain additional circuitry required by the arrays 20.

FIG. 3 illustrates a 128 megabit portion of the SDRAM circuit 10 consisting of a throat region 60 centrally located between two 64 megabit arrays $20_a$, $20_b$. The first array $20_a$ contains at least one memory block $30_a$ and sense amplifier circuit $52_a$. Digit lines $80_a$ of the first array $20_a$ are organized in a vertical direction while row lines $82_a$ of the first array $20_a$ are organized in a horizontal direction. The second array $20_b$ contains at least one memory block $30_b$ and sense amplifier circuit $52_b$. Digit lines $80_b$ of the second array $20_b$ are organized in a vertical direction while row lines $82_b$ of the second array $20_b$ are organized in a horizontal direction.

The throat 60 contains row logic 64 and a datapath 70. The row logic 64 contains LT drivers 62 and array drivers 66. The LT drivers 62 are global row decoders that drive LT lines 68 connected to the row drivers of both arrays $20_a$, $20_b$. As such, the LT drivers 62 are "bidirectional" (i.e., the LT driver 62 drive two different arrays $20_a$, $20_b$, the first array $20_a$ being driven in a first direction and the second array $20_b$ being driven in a second direction). The array drivers 66 include PH (phase), EQ (equilibration), ISO (isolation), NSA (n-sense amplifier control), PSA (p-sense amplifier control) drivers required to drive lines 67 connected to the sense amplifiers $52_a$, $52_b$. Thus, the row logic 64 of the throat 60 supports both arrays $20_a$, $20_b$ in a bidirectional manner.

The illustrated datapath 70 contains IO circuits 72 having drivers for driving four 10 pairs 74 connected to the first and second arrays $20_a$, $20_b$. As such, the datapath 70 and the IO circuits 72 are bidirectional. The illustrated SDRAM 10 uses four IO pairs 74 per block $30_a$, $30_b$ to obtain a 2n pre-fetch. It is desirable to increase the number of IO pairs 74 and enhance the overall performance of the DDR SDRAM 10, while simplifying its architecture and the routing of the lines interconnecting the throat 60 and the arrays $20_a$, $20_b$.

Moreover, although not shown in FIG. 3, the throat 60 and the arrays $20_a$, $20_b$ share the same power bussing. With this configuration, power spikes and other sensitivities in the peripheral circuitry (e.g., throat 60) can adversely affect the array 20. Similarly, power spikes and other sensitivities in the arrays 20 can adversely affect the periphery, its IO circuitry and signal lines. Preventing noise from affecting the arrays 20 and the periphery will improve the performance of the SDRAM 10. Accordingly, there is a need and desire for a DDR SDRAM 10 with improved power bussing for the memory arrays 20 and peripheral circuitry (such as the throat 60).

SUMMARY

The present invention provides a DDR SDRAM with an increased number of IO pairs per memory block and enhanced overall performance, yet simplified architecture and signal line routing.

The present invention also provides a DDR SDRAM with improved power bussing for memory arrays and peripheral circuitry contained within the SDRAM.

The above and other features and advantages are achieved in various embodiments of the invention by providing a DDR SDRAM where unidirectional row logic is associated with and connected to a single memory array instead of being associated with and connected to multiple memory arrays. The unidirectional row logic is located in the outward periphery of its associated array, but is not within a throat region between two arrays. The location of the row logic allows the throat region to include more bidirectional IO circuitry and signal lines servicing two arrays, which increases the performance of the SDRAM. In addition, separate power bussing is employed for the memory arrays and IO circuitry. This prevents noise from the arrays from affecting the IO circuitry and signal lines of the throat region and vice versa.

BRIEF DESCRIPTION OF THE DRAWINGS

The foregoing and other advantages and features of the invention will become more apparent from the detailed description of exemplary embodiments provided below with reference to the accompanying drawings, in which:

FIGS. 5A, 5B and 5C illustrate the relationship between a substrate assembly and three metallization layers of an integrated circuit memory device constructed in accordance with an embodiment of the invention.

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention.

Figure 4:
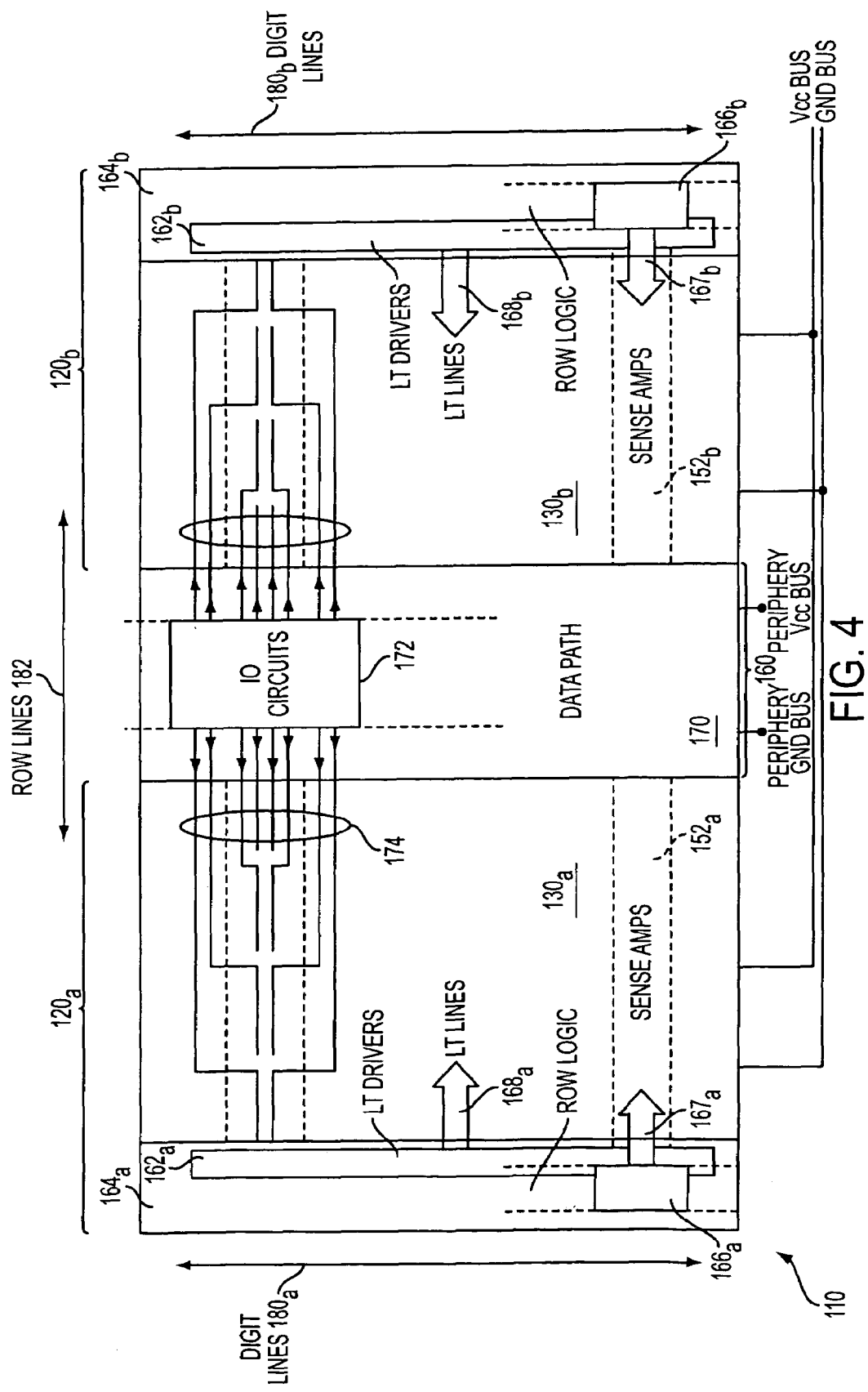
FIG. 4 is a block diagram illustrating a portion of a DDR SDRAM constructed in accordance with an exemplary embodiment of the invention.

Now referring to the figures, where like reference numbers designate like elements, FIG. 4 shows a 128 megabit portion of a DDR SDRAM integrated circuit 110 constructed in accordance with an exemplary embodiment of the invention. The SDRAM 110 includes a throat region 160 centrally located between two 64 megabit arrays $120_a$, $120_b$. The first array $120_a$ contains at least one memory block $130_a$ and sense amplifier circuit $152_a$. Digit lines $180_a$ of the first array $120_a$ are organized in a vertical direction while row lines 182 of the first and second arrays $120_a$, $120_b$ are organized in a horizontal direction. The second array $120_b$ contains at least one memory block $130_b$ and sense amplifier circuit $152_b$. Digit lines $180_b$ of the second array $120_b$ are organized in a vertical direction. It should be noted that the invention is not limited to the illustrated size of the first and second arrays $120_a$, $120_b$. That is, the invention could use first and second arrays $120_a$, $120_b$ greater than or less than 64 megabits depending upon the desired application. Likewise, although the invention provides a DDR SDRAM having a size of at least one gigabit, the invention is not to be limited to any particular size.

In the illustrated embodiment, the throat 160 contains only a datapath 170. Unlike the SDRAM 10 of FIG. 3, two unidirectional row logic circuits $164_a$, $164_b$ are used in the illustrated SDRAM 110. The term "unidirectional" is used to represent the fact that the row logic circuits $164_a$, $164_b$ respectively drive one array $120_a$, $120_b$ in one direction relative to the circuits $164_a$, $164_b$. That is, a first unidirectional row logic circuit $164_a$ is connected to and associated with the first array $130_a$ only and a second unidirectional row logic circuit $164_b$ is connected to and associated with the second array $130_b$ only. "Unidirectional" does not mean that the conductors between the row logic circuits $164_a$, $164_b$ and their respective array $120_a$, $120_b$ are special conductors only allowing signals to be transmitted in one direction. That is, any conductors can be used between the row logic circuits $164_a$, $164_b$ and their respective array $120_a$, $120_b$ even though the row logic circuits $164_a$, $164_b$ are considered unidirectional.

The first row logic circuit $164_a$ contains LT drivers $162_a$ and array drivers $166_a$. The LT drivers $162_a$ are global row decoders that drive LT lines $168_a$ connected to the row drivers of the first array $120_a$ in a unidirectional manner. The array drivers $166_a$ include PH (phase), EQ (equilibration), ISO (isolation), NSA (n-sense amplifier control), PSA (p-sense amplifier control) drivers required to drive lines $167_a$ connected to the sense amplifier circuitry $152_a$ of the first array $120_a$. Thus, the first row logic circuit $164_a$ is not located within the throat 160 and supports only the first array $120_a$ (i.e., unidirectional). The significance of this architecture is explained below.

The second row logic circuit $164_b$ contains LT drivers $162_b$ and array drivers $166_b$. The LT drivers $162_b$ are global row decoders that drive LT lines $168_b$ connected to the row drivers of the second array $120_b$ in a unidirectional manner. The array drivers $166_b$ include PH (phase), EQ (equilibration), ISO (isolation), NSA (n-sense amplifier control), PSA (p-sense amplifier control) drivers required to drive lines $167_b$ connected to the sense amplifier circuitry $152_b$ of the second array $120_b$. Thus, the second row logic circuit $164_b$ is not located within the throat 160 and supports only the second array $120_b$ (i.e., unidirectional manner).

Figure 5A:
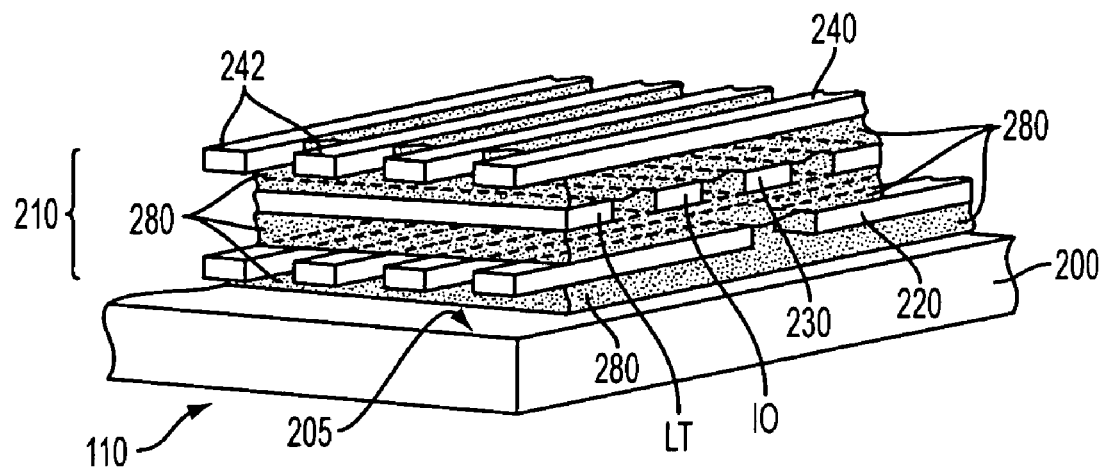

To understand the significance of using two unidirectional row logic circuits $164_a$, $164_b$ removed from the throat region 160, a brief description of how the layers of the SDRAM 110 are organized is now provided. Referring to FIG. 5A, which shows a portion of the IC memory device in perspective view, and to FIG. 5B, which shows the same portion in an elevated sectional view, the integrated circuit 110 includes a substrate assembly 200 and a conductor portion 210. The conductor portion 210 defines at least first 220, second 230, and third 240 layers of metalization. It should be noted that a layer of metalization includes a plurality of discrete traces 242 or conductors arranged in a pattern. Accordingly a first set of traces defines a metal-1 220 layer, a second set of traces defines a metal-2 230 layer, and a third set of traces defines a metal-3 240 layer.

The invention uses three layers of metal traces 242 deposited on layers of insulation 280 disposed above a substrate assembly 200. In a particular embodiment, the present invention includes three layers of metal traces 220, 230, 240 disposed above, and substantially parallel to an upper surface 205 of a substrate assembly 200. The substrate assembly includes doped active regions, gate stacks, polysilicon plugs and a limited number of polysilicon lines. In addition, as known in the art capacitor structures are also fabricated in the memory array above the surface 205 of the substrate and below the three layers of metalization.

Each metal layer is disposed in spaced relation to the other metal layers, and to the substrate assembly 200 of the integrated circuit 110, which contains fabricated devices. Interlayer insulating regions are defined between adjacent layers of metal, and between the metal-1 layer 220 and the substrate assembly 200 of the integrated circuit 110. Thus, a first interlayer region 250 is provided between metal-1 and a surface 205 of the substrate assembly 200 of the integrated circuit 100, a second interlayer region 260 is provided between metal-2 and metal-1, and a third interlayer region 270 is provided between metal-3 and metal-2. Electrically insulating material 280 is generally placed throughout the interlayer regions. As is understood in the art, one or more conventional materials may be used for this purpose.

Since each row logic circuit $164_a$, $164_b$ supports one 64 megabit array $120_a$, $120_b$ instead of two, they are designed to be unidirectional. As such, metal-2 and metal-3 layers are interleaved in parallel throughout the length of the row logic circuits $164_a$, $164_b$, utilizing maximum routing and power bussing efficiency; thus, increasing performance of the SDRAM 110. This allows a redesign of the LT driver $162_a$, $162_b$ using buried digit lines. The change in row logic design methodology greatly reduces the design area as compared to the prior art, and subsequently saves die area as the pattern is repeated across the length of the die.

Figure 1:
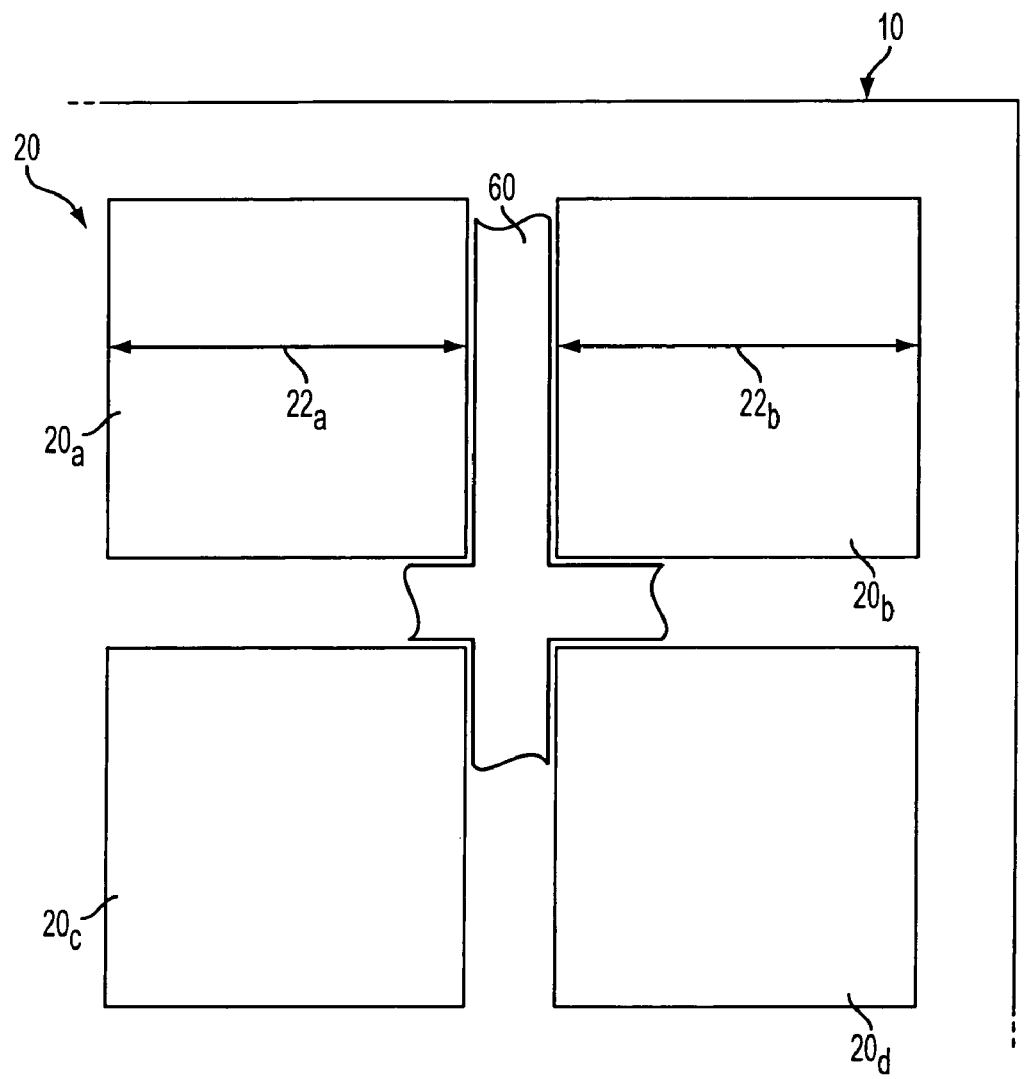
FIG. 1 is a block diagram of a portion of a DDR SDRAM integrated circuit.
Figure 2:
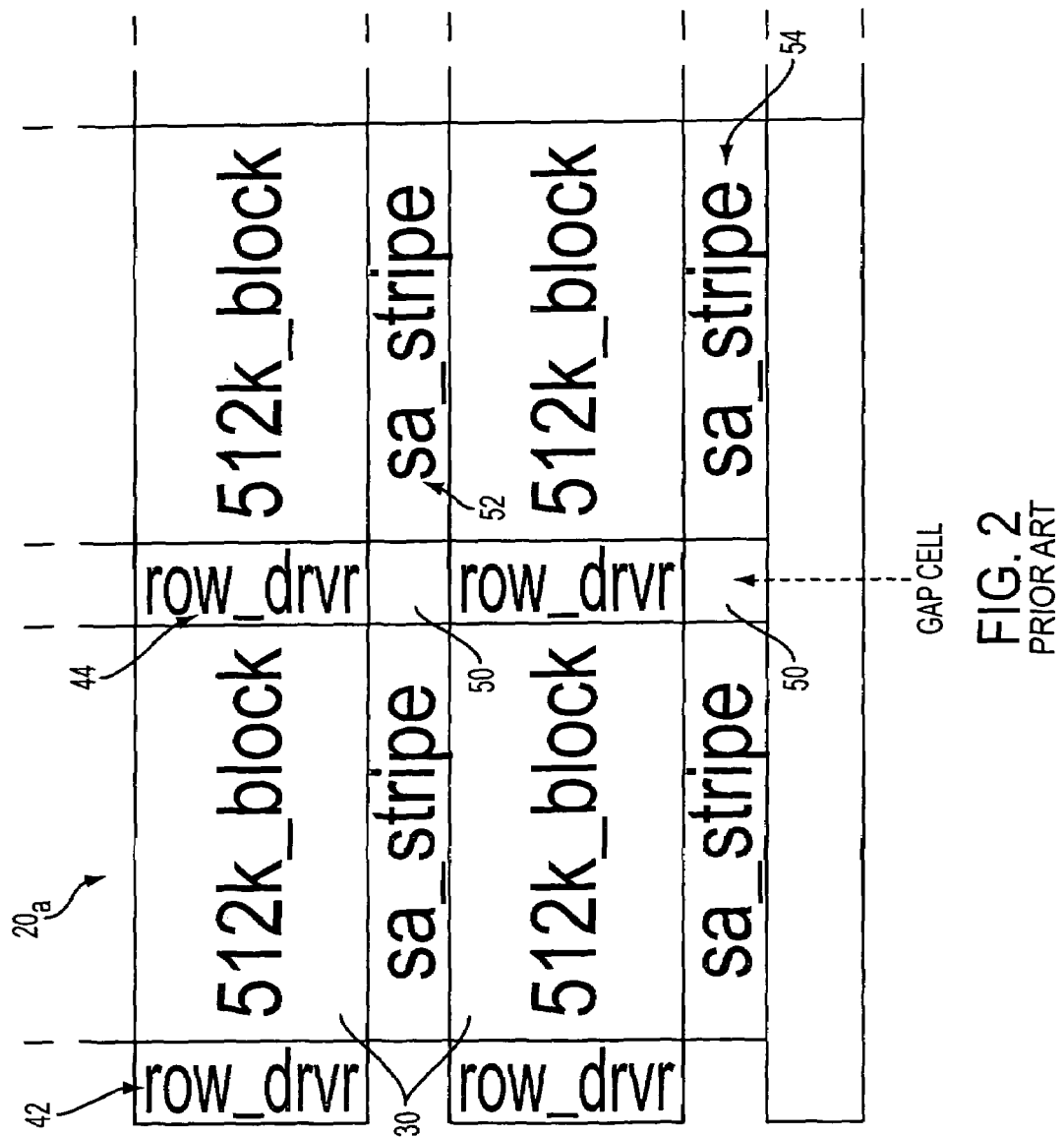
FIG. 2 is a block diagram illustrating memory blocks used in the SDRAM illustrated in FIG. 1.
Figure 5B:
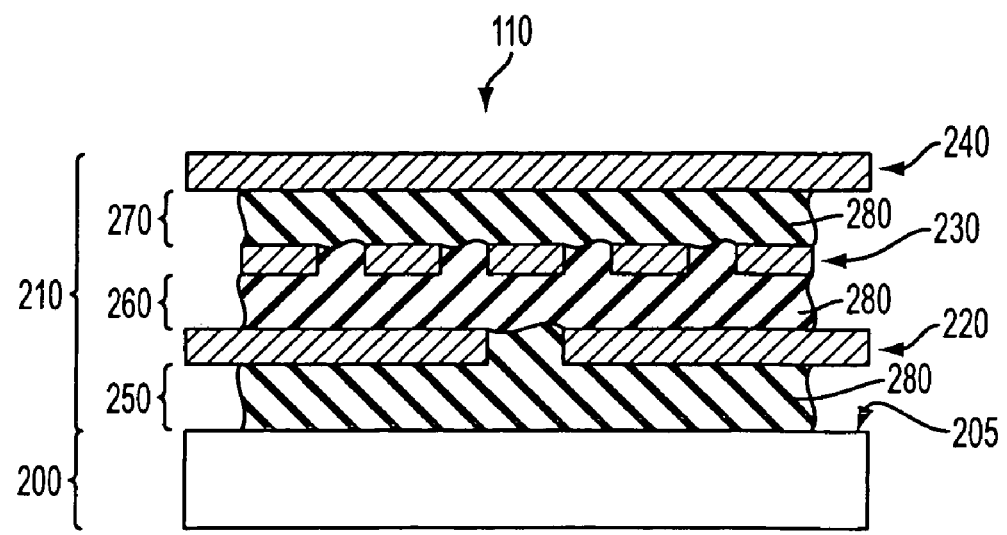

The illustrated datapath 170 contains IO circuits 172 having enough drivers to drive eight bidirectional IO pairs 174 connected to the first and second arrays 120$_a$, 120$_b$. The illustrated SDRAM 110 uses eight IO pairs 174 per block 130$_a$, 130$_b$ to obtain a 4n pre-fetch. Thus, the illustrated embodiment includes four IO pairs in addition to the four IO pairs used in the DDR SDRAM 10 illustrated in FIG. 3. Thus, the illustrated DDR SDRAM contains two times the number of IO pairs per block than prior SDRAMs. In a desired embodiment, the additional four IO pairs are routed across the array cores, running parallel to the LT metal-2 lines (thus being shielded by them) as shown in FIG. 5B. The additional IO pairs are routed to metal-3 over the array gap cells 50 and are dropped into the sense amplifier circuits 152$_a$, 152$_b$ at the array gap cells 50 shown by arrow A (illustrated in FIG. 2C). Thus, in the desired embodiment, the sense amplifier cell height is unaffected by the additional IO signal lines. As such, the illustrated SDRAM 110 utilizes standard sense amplifier circuitry. This means that the SDRAM 110 has twice as many IO pairs, yet does not have increased die size in comparison to prior SDRAMs (e.g., SDRAM 10 of FIG. 3).

Figure 3:
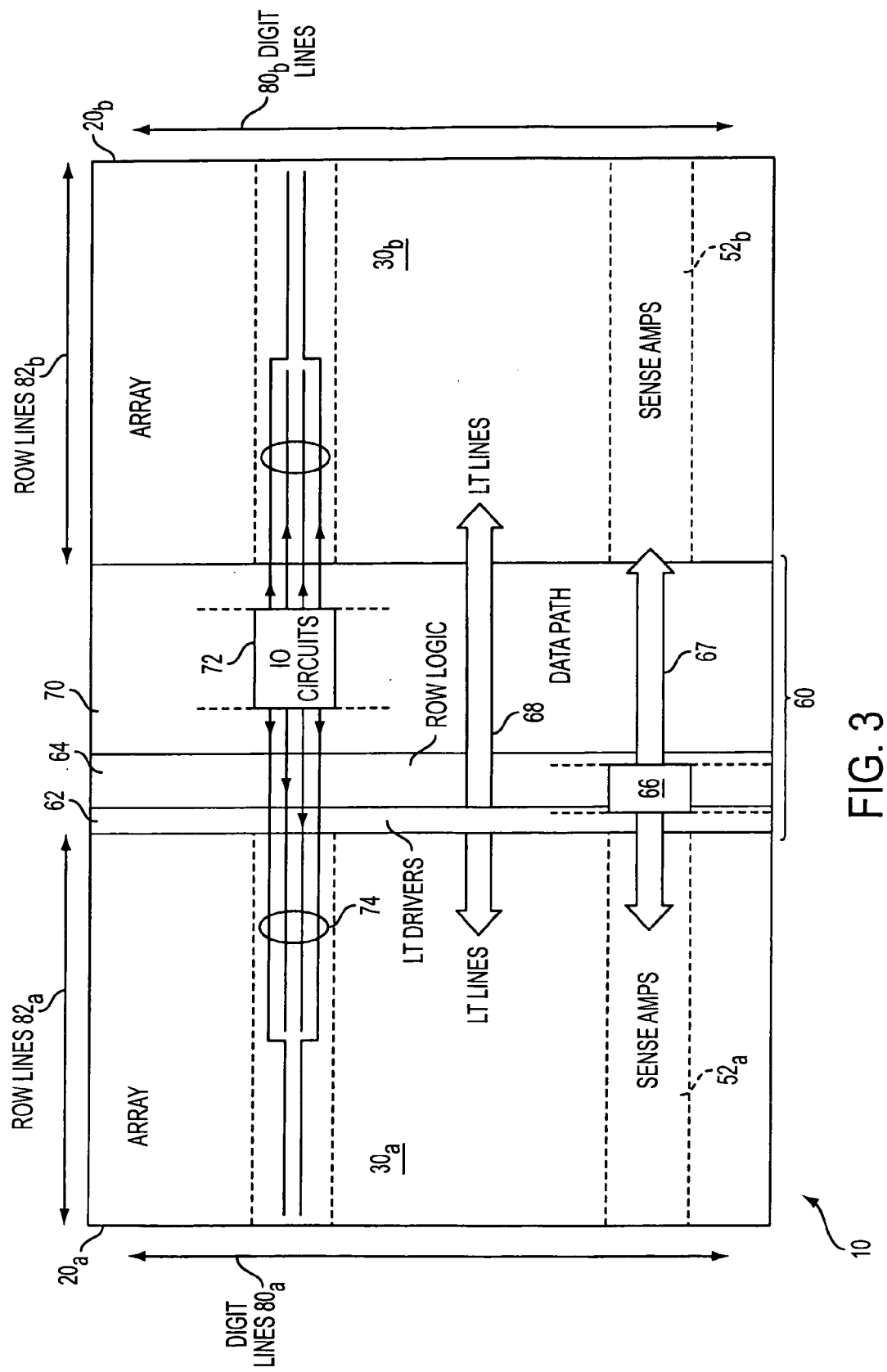
FIG. 3 is a block diagram illustrating two memory arrays and a throat region contained in the DDR SDRAM illustrated in FIG. 1.

In a desired embodiment, the arrays 120$_a$, 120$_b$ share the same power bussing. That is, the arrays 120$_a$, 120$_b$ share a power supply bus such as an array Vcc bus and an array ground potential bus (Gnd bus). The datapath 170, on the other hand, is connected to periphery Vcc and Gnd power bussing. The separation of the array and periphery power bussing prevents power spikes and other sensitivities that may be experienced in the SDRAM 10 illustrated in FIG. 3. Moreover, the separation of the row logic and datapath from a centralized throat region also simplifies the interface and hookup from peripheral areas (i.e., non-array areas) of the SDRAM 110. This alleviates the congestion of signals and power bussing usually found at these areas. This also improves the overall performance of the SDRAM 110 in comparison to the SDRAM 10 (FIG. 3).

Figure 6:
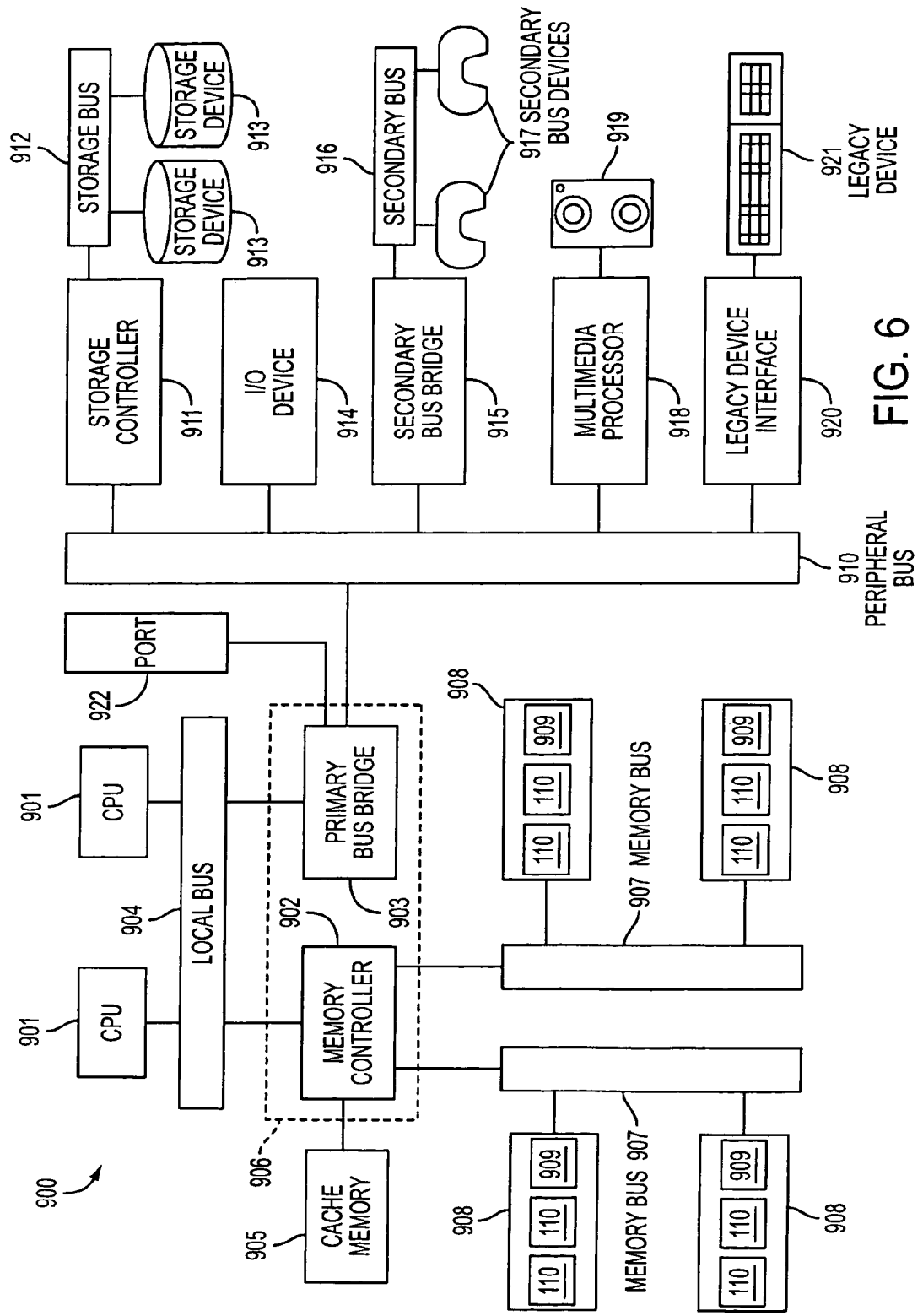
FIG. 6 is a block diagram of a processor system utilizing the DDR SDRAM constructed in accordance with the invention.

FIG. 6 illustrates an exemplary processing system 900 which may utilize a memory device 110 constructed in accordance with an embodiment of the present invention. That is, the memory device 110 is a DDR SDRAM having unidirectional row logic, increased IO lines, and improved routing and power bussing as illustrated in FIG. 4.

The processing system 900 includes one or more processors 901 coupled to a local bus 904. A memory controller 902 and a primary bus bridge 903 are also coupled to the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 110 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus 916 to the processing system. For example, the secondary bus bridge 915 may be a universal serial port (USB) controller used to couple USB devices 917 to the processing system 900. The multimedia processor 918 may be a sound card, a video capture card, or any other type of media interface, which may also be coupled to additional devices such as speakers 919. The legacy device interface 920 is used to couple legacy devices 921, for example, older styled keyboards and mice, to the processing system 900.

The processing system 900 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 110. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The processes and devices described above illustrate exemplary methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An integrated circuit memory device comprising:
    a substrate assembly comprising first and second memory arrays separated by a throat region, the throat region comprising a data path;
    first, second and third metal layers, each layer being disposed in substantially parallel spaced relation over said substrate assembly, each layer including a plurality of traces;
    a plurality of IO lines connected between said memory arrays and said throat region, wherein a first portion of said IO lines are routed through said second metal layer and a second different portion of said IO lines are routed through said third metal layer;
    a first row logic circuit respectively connected to and associated with said first memory array and located on a side of said first memory array opposite a side of said first memory array that is adjacent said throat region; and
    a second row logic circuit respectively connected to and associated with said second memory array and located on a side of said second memory array opposite a side of said second memory array that is adjacent said throat region.

2. The integrated circuit memory device of claim 1, wherein said IO lines are connected to sense amplifier circuitry within said memory arrays.

3. The integrated circuit memory device of claim 2, wherein said IO lines are routed through gap cells to the sense amplifier circuitry.

4. A processing system comprising:
    an integrated circuit memory device comprising:
    a substrate assembly comprising first and second memory arrays separated by a throat region, the throat region comprising a data path;
    first, second and third metal layers, each layer being disposed in substantially parallel spaced relation over said substrate assembly, each layer including a plurality of traces;
    a plurality of IO lines connected between said memory arrays and said throat region, wherein a first portion of said IO lines are routed through said second metal layer and a second different portion of said IO lines are routed through said third metal layer;
    a first row logic circuit respectively connected to and associated with said first memory array and located on a side of said first memory array opposite a side of said first memory array that is adjacent said throat region; and
    a second row logic circuit respectively connected to and associated with said second memory array and located on a side of said second memory array opposite a side of said second memory array that is adjacent said throat region.

5. The system of claim 4, wherein said IO lines are connected to sense amplifier circuitry within said memory arrays.

6. The system of claim 5, wherein said IO lines are routed through gap cells to the sense amplifier circuitry.

7. A method of forming an integrated circuit memory device, said method comprising:
    forming a substrate assembly comprising first and second memory arrays separated by a throat region, the throat region comprising a data path;
    forming first, second and third metal layers, each layer being disposed in substantially parallel spaced relation over said substrate assembly, each layer including a plurality of traces;
    forming a plurality of IO lines connected between said memory arrays and said throat region;
    forming a first row logic circuit respectively connected to and associated with said first memory array and located on a side of said first memory array opposite a side of said first memory array that is adjacent said throat region; and
    forming a second row logic circuit respectively connected to and associated with said second memory array and located on a side of said second memory array opposite a side of said second memory array that is adjacent said throat region,
    wherein a first portion of said IO lines are routed through said second metal layer and a second different portion of said IO lines are routed through said third metal layer.

8. The method of claim 7, wherein said IO lines are connected to sense amplifier circuitry within said memory arrays.

9. The method of claim 8, wherein said IO lines are routed through gap cells to the sense amplifier circuitry.

* * * * *

UNITED STATES PATENT AND TRADEMARK OFFICE
CERTIFICATE OF CORRECTION

| | | |
|---|---|---|
| PATENT NO. | : 7,236,385 B2 | Page 1 of 1 |
| APPLICATION NO. | : 10/879158 | |
| DATED | : June 26, 2007 | |
| INVENTOR(S) | : J.W. Thompson et al. | |

It is certified that error appears in the above-identified patent and that said Letters Patent is hereby corrected as shown below:

Column 2, line 10, "four 10 pairs" should read --four IO pairs--.

Signed and Sealed this

Eleventh Day of September, 2007

JON W. DUDAS
*Director of the United States Patent and Trademark Office*